(12) United States Patent
Goossen et al.

(10) Patent No.: US 6,277,668 B1
(45) Date of Patent: Aug. 21, 2001

(54) OPTICAL DETECTOR FOR MINIMIZING OPTICAL CROSSTALK

(75) Inventors: Keith W. Goossen, Aberdeen; Ashok V. Krishnamoorthy, Middletown, both of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/477,095

(22) Filed: Jan. 4, 2000

(51) Int. Cl.$^7$ ....................................... H01L 21/00
(52) U.S. Cl. ......................................... 438/69
(58) Field of Search ............................ 438/48, 57, 65, 438/69, 72, 926; 257/428, 435, 466; 359/153; 372/50; 385/14

(56) References Cited

U.S. PATENT DOCUMENTS

| | | |
|---|---|---|
| 5,177,580 | 1/1993 | Norton et al. . |
| 5,237,434 | 8/1993 | Feldman et al. . |
| 5,753,941 | 5/1998 | Shin et al. . |
| 5,757,836 * | 5/1998 | Jiang et al. ............................ 372/50 |
| 5,778,018 | 7/1998 | Yoshikawa et al. . |
| 5,848,086 | 12/1998 | Lebby et al. . |
| 5,877,038 | 3/1999 | Coldren et al. . |
| 5,879,961 | 3/1999 | Scott . |
| 5,903,590 | 5/1999 | Hadley et al. . |
| 5,912,913 | 6/1999 | Kondow et al. . |
| 5,956,363 | 9/1999 | Lebby et al. . |
| 5,966,399 | 10/1999 | Jiang et al. . |
| 5,969,417 | 10/1999 | Yamashita et al. . |
| 6,001,664 * | 12/1999 | Swirhun et al. ....................... 438/31 |

OTHER PUBLICATIONS

"Scaling Optoelectronic–VLSI Circuits into the 21$^{st}$ Century: A Technology Roadmap", Ashok V. Krishnamoorthy, and David A.B. Miller. IEEE Journal of Selected Topics in Quantum Electronics, vol. 2, No. 1, Apr. 1996.

"Modulation and Free–Space Link Characteristics of Monolithically Integrated Vertical–Cavity Lasers and Photodetectors with Microlenses", D.A. Louderback, O. Sjolund, E.R. Hegblom, S. Nakagawa, J. Ko, and L.A. Coldren. IEEE Journal of Selected Topics in Quantum Electronics, vol. 5, No. 2 Mar./Apr. 1999.

"Vertical–Cavity Surface–Emitting Lasers Flip–Chip Bonded to Gigabit–per–Second CMOS Circuits", A.V. Krishnamoorthy, L.M.F. Chirovsky, W.S. Hobson, R.E. Leibenguth, S.P. Hui, G.J. Zydzik, K.W. Goossen, J.D. Wynn, B.J. Tseng, J. Lopata, J.A. Walker, J.E. Cunningham, and LA. D'Asaro. IEE Photonics Technology Letters, vol. 11, No. 1 Jan. 1999.

Multiple Attachment GaAs–on–Si hybrid Optoelectronic/VLSI Chips, K.W. Goossen, B. Tseng, S.P. Hui, J.A. Walker, R. Leibenguth, L.M.F. Chirovsky, and A. Krishnamoorthy; (Lucent Technologies Bell Laboratories, Holmdel, NJ, Murray Hill, NJ) submitted to 1996 IEEE LEOS Smart Pixel Topical Meeting.

* cited by examiner

Primary Examiner—Keith Christianson

(57) ABSTRACT

An optical detector is provided including a substantially annular metallic ring positioned on either side of an active (i.e. intrinsic) region of the optical detector to minimize optical crosstalk. Optical crosstalk originates from adjacent optical sources (e.g., VCSELs) emitting light toward the direction of the optical detector. The metallic ring prevents the light which propagates substantially parallel to a base of the optical detector from reaching the active region of the optical detector.

10 Claims, 4 Drawing Sheets

OPTICAL DETECTOR FOR MINIMIZING OPTICAL CROSSTALK

BACKGROUND OF THE INVENTION

1. Field of the Invention

The present invention relates to optical devices, and in particular, to an optical detector which minimizes optical crosstalk.

2. Description of the Related Art

Future high-performance computing will rely on high-density, high-speed electronics linked by high density optical interconnects. Two-dimensional arrays of vertical cavity surface-emitting lasers (VCSELs) will accelerate this evolution. In addition to their use as high density optical interconnects, VCSELs find application in areas ranging from optical communication, optical recording and readout systems, to laser printers and scanners. In the field of optical communications, VCSELs can be advantageously used to provide high bandwidth optical interconnections over fiber optic cable for data communications applications. Because VCSELs can be produced in larger arrays; can be tested in parallel; and because their laser emissions are relatively easy to couple to multi-mode fiber because they emit light perpendicular to the surface of the die; VCSELs have been recognized as an efficient, low cost, alternative to edge emitting semiconductor lasers. It is projected that VCSELs will ultimately dominate the data-networking market, replacing copper as the preferred means of communications for local-area-networking as data-rates reach and exceed 1 Gbit/s.

VCSEL sources are typically driven electrically from separate (off-chip) drivers which significantly increase the power dissipation of the driver-VCSEL package and affect the bandwidth of the link. There is significant opportunity to further increase their efficiency and performance, especially at 10 Gigabit/s and higher rates, by flip-chip bonding VCSEL devices directly to the driver electronics. It is also contemplated that by also flip-chip bonding arrays of optical detectors to a silicon very large scale integration (VLSI) chip, the combined arrays of VCSELs and detectors would comprise a large number of high-speed optical inputs and outputs connected directly to the processing and switching CMOS circuits on-chip.

Conservative assumptions suggest that hybrid I/O technology as described has substantial room for continued scaling to a large numbers of higher-speed interconnects. Future opto-electronic VLSI technologies will provide an I/O bandwidth to a chip that is commensurate with the processing power of the chip, even in the finest linewidth silicon, a task with which conventional electrical interconnect technologies cannot compete. It is anticipated that the availability of hybrid I/O technology will provide a terabit-per-second throughput switch with low power requirements.

In recent years, there has been an ongoing effort to perform flip-chip bonding of photonic devices to silicon CMOS circuits. It has been shown that it is possible to create three-dimensional OE-VLSI structures, with the flip-chip bonded photonic devices placed directly above the silicon CMOS circuitry. See, e.g., K. W. Goossen and A. V. Krishnamoorthy, "Optoelectronics-in-VLSI" *Wiley Encyclopedia of Electrical and Electronic Engineering*, vol. 15, pp. 380–395, 1999. The photonic devices include optical detectors and modulator devices, and more recently flip-chip bonded VCSEL emitter arrays to CMOS circuits. See A. V. Krishnamoorthy, L. M. F. Chirovsky, et al., "Vertical Cavity Surface Emitting Lasers Flip-chip Bonded to Gigabit/s CMOS Circuits," *IEEE Photonics Technology Letters*, vol. 11, no. 1, pp. 128–130, January 1999. It has also been demonstrated that it is possible to make multiple sequential attachments of photonic devices to the CMOS circuits (e.g., detectors and lasers). It is therefore shown that the technology of marrying photonic devices to silicon CMOS circuits is a mature technology in the sense that it has been readily demonstrated that both detector and emitter devices can be bonded to silicon VLSI chips. It has also been demonstrated that VCSELs and resonant photodetectors can be fabricated simultaneously on the same wafer and share the same epitaxial growth structure. Although the processing of the photonic devices can become more involved in the latter case, only a single attachment step is required to attach both emitters and detectors to the Silicon CMOS substrate.

One of the key issues in operating large arrays of VCSEL and optical detector devices is to minimize the detrimental effects of crosstalk between the photonic devices and their associated communication channels. Inter-channel crosstalk can be caused by electrical interference between signals on the chip, which can be reduced by proper chip layout and reduction of off-chip parasitics, and can also be due to stray light from another channel unintentionally reaching the incorrect detector. This latter type of optical crosstalk (i.e., stray light) can be quite substantial if the detectors and VCSELs are not designed to prevent this. This is particularly relevant when arrays of VCSEL emitters and optical detectors are interleaved and stray light propagates parallel to the chip. FIG. 1 illustrates the stray light phenomenon for a single VCSEL under operating conditions. Specifically, FIG. 1 is a microphotograph of a VCSEL 10 under lasing conditions as seen with an infrared camera and attenuated by three orders of magnitude. Even when attenuated, one finds that a significant amount of light escapes (i.e., strays) from the surrounding laser mesa. These emissions correspond to spontaneous, and amplified spontaneous emission and scatter from the mesa sidewalls.

FIG. 2 illustrates a conventional VCSEL 21 and optical detector 23 which are grown on the same wafer. It is important to note that there is a high potential for crosstalk due to spontaneous emissions from the active region 25 of the VCSEL 21 and the corresponding active region 27 of the detector 23.

Therefore, there is a need for an optical detector suitable for performing optical signal processing functions in an optical system which minimizes or provides enhanced immunity to crosstalk without necessitating expensive fabrication techniques.

SUMMARY OF THE INVENTION

The present invention provides an optical detector for minimizing optical crosstalk. The optical detector minimizes optical crosstalk by preventing light from entering the detector's active region. The improved optical detector reduces optical crosstalk by including a metallic barrier on either side of the active (i.e., intrinsic) region of the detector. The metallic barrier is embedded in the base of a primary fabrication layer of the detector. Preferably, the metallic barrier is constructed as two semi-circular rings having two small gaps there between. The barrier can also be constructed as a single circular metallic ring in an alternate embodiment. The metallic barrier is used to create an optical isolation zone around the optical detector's active region, thereby preventing light originating from an adjacent optical source, such as a VCSEL, from reaching the active region of the detector.

In addition to its primary function as an optical barrier, the metallic ring of the inventive optical detector can be used as a contact point for flip-chip integration with a VLSI (e.g., CMOS) circuit. Accordingly, the metallic barrier is doped with an impurity identical to the impurity type of the material in which the barrier is embedded.

The optical detector of the present invention advantageously minimizes optical crosstalk without significantly increasing the detector size or fabrication complexity. The present invention thus overcomes the problems associated with optical crosstalk, thereby providing improved performance in optical communication systems as well as other optical signal processing applications.

BRIEF DESCRIPTION OF THE DRAWINGS

The features of the present invention will become more readily apparent and may be better understood by referring to the following detailed description of the present invention, taken in conjunction with the accompanying drawings, where:

FIG. 3b is a schematic top views of the optical detector of FIG. 3a;

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied, in many different forms and should not be construed as limited to the embodiments set forth herein.

Figure 1:
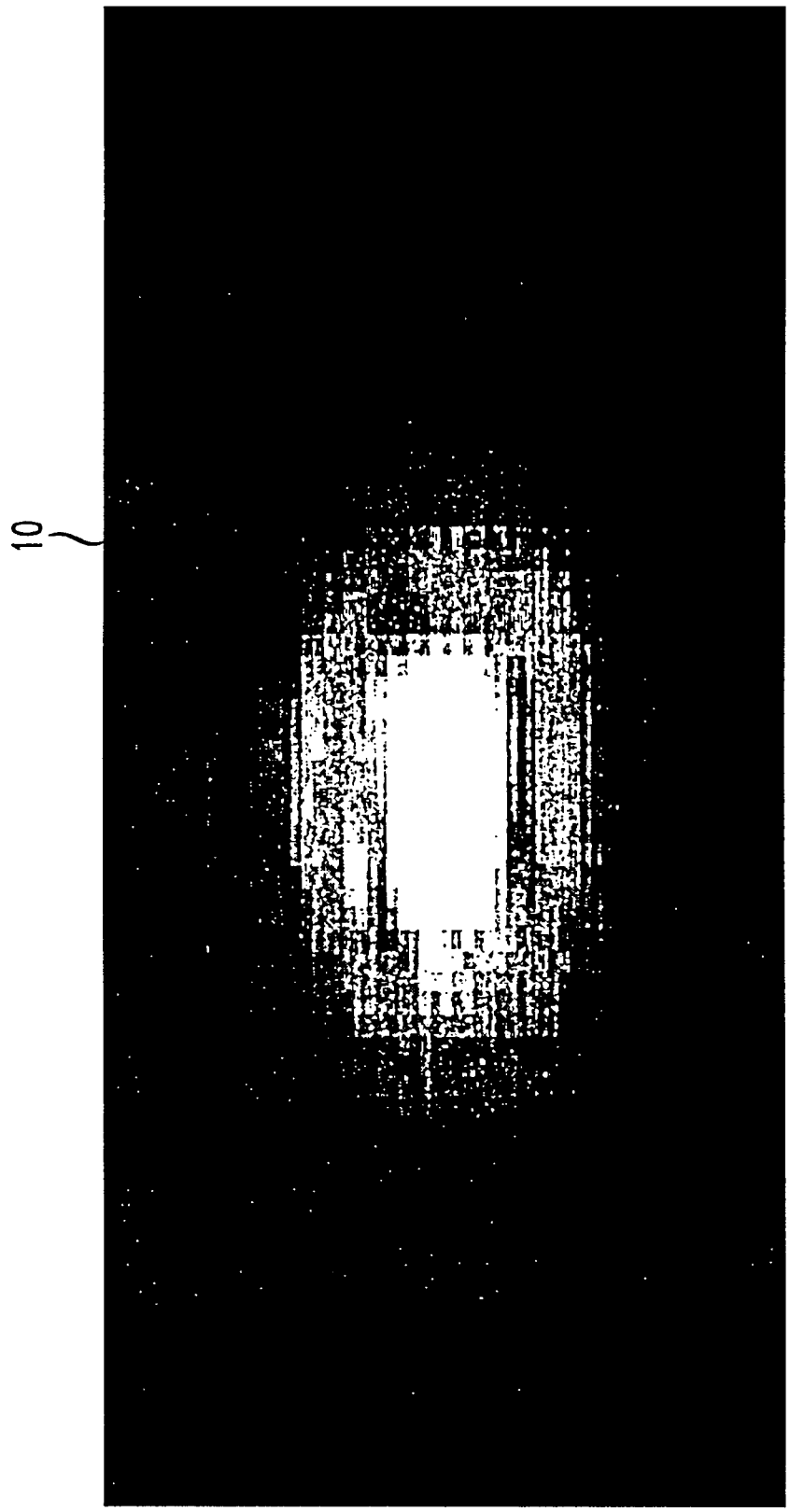
FIG. 1 is a microphotograph of a known VCSEL under lasing conditions as seen with an infrared camera, attenuated by three orders of magnitude.
Figure 2:
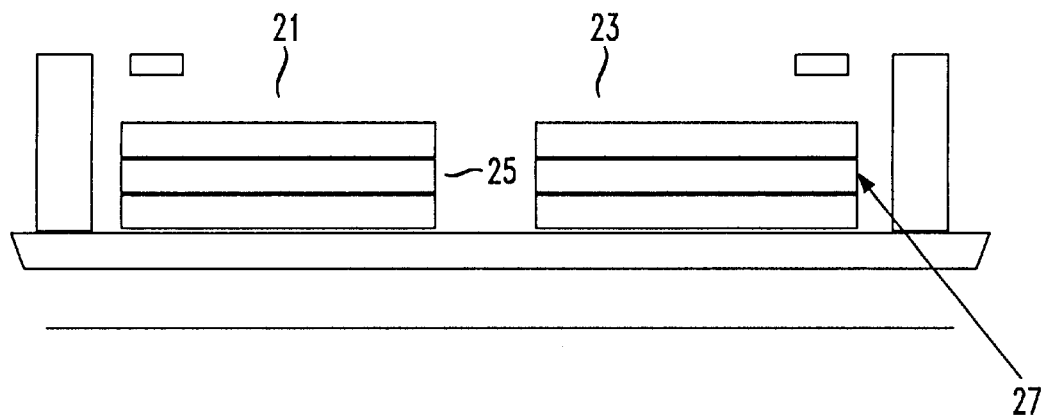
FIG. 2 is a schematic cross-sectional view of a prior-art VCSEL and optical detector co-fabricated on the same substrate.
Figure 3A:
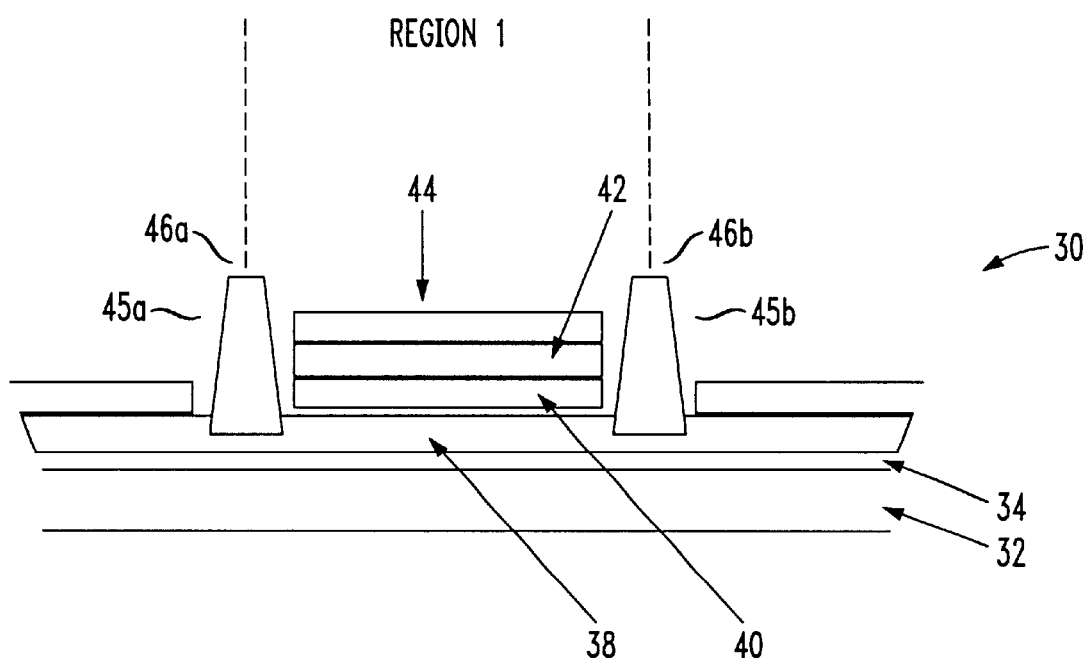
FIG. 3a is a schematic cross-sectional view of an optical detector on a substrate separate from an optical source, according to the present invention.
Figure 3B:
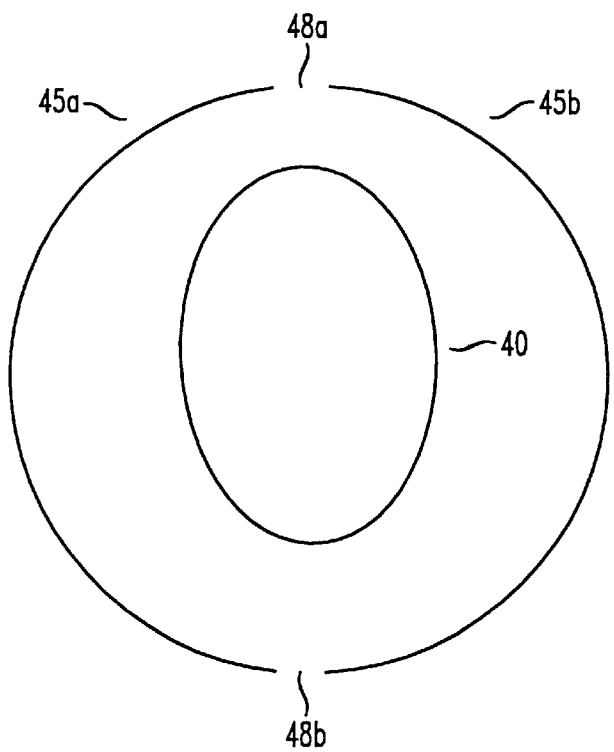
Figure 3C:
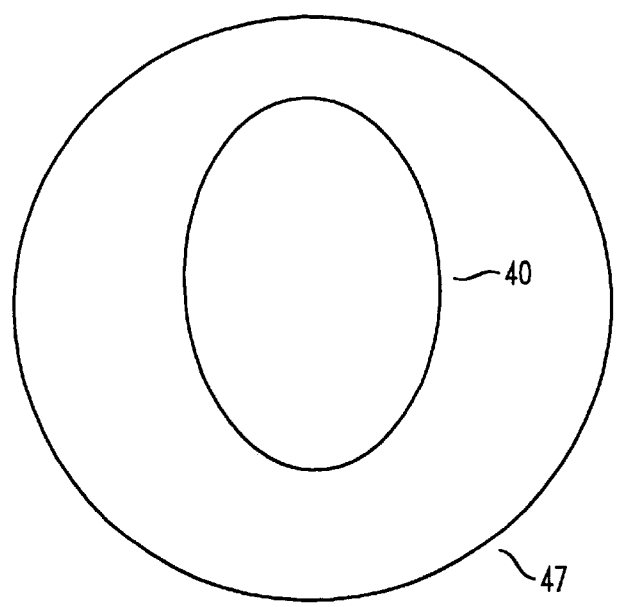
FIG. 3c is a schematic top view of an alternate embodiment of the optical detector.

A first embodiment of the optical detector 30 according to the invention is shown by FIGS. 3a–3c. FIG. 3a illustrates an optical detector 30 comprising a substrate 32, a stop-etch layer 34, a p-type layer 38, an active layer 40, an n-type layer 42, and an N-contact 44 which are all sequentially formed on the substrate 32. Embedded in the p-type layer 28 are two semi-circular metallic rings 45a and 45b on either side of the active layer 40, acting as a barrier to prevent scattered light from reaching the active layer 40. That is, the rings 45a and 45b are fabricated with a sufficient vertical geometry to prevent scattered light from reaching and impinging upon the active layer 40 of the detector.

FIG. 3b is a top view of the optical defector 30 which illustrates the active layer 40 surrounded by the two semi-circular metallic rings 45a and 45b. The two semi-circular metallic rings 45a and 45b having two small gaps 48a and 48b therebetween on the order of about 10 microns.

FIG. 3c illustrates an alternate embodiment in which the metallic barrier is constructed as a single circular metallic ring 47. From a fabrication perspective, the gaps 48a and 48b as shown by FIG. 3b are desirable, since it is difficult to accomplish photolithography on a single circular metallic ring as illustrated in FIG. 3c. It should be noted, however, that irrespective of whether the metallic ring is embodied as a single ring or two semi-circular rings with two small gaps there between, an optical isolation zone is created in both embodiments. For example, in FIG. 3a, the optical isolation zone is identified as "REGION 1".

While the metallic rings 45a and 45b serve as a barrier to prevent scattered light propagating parallel to the substrate 32 and the various layers from impinging upon the active layer 40, the rings may also serve a as a contact point for flip-chip integration. Referring to FIG. 3a, a top surface of the metallic rings 46a and 46b serves as a p-contact point for a flip-chip bonding process. See, "A. L. Lentine et al., High-Speed Optoelectronic VLSI switching chip with >4000 optical I/O based on flip-chip bonding of MQW modulators and detectors to silicon CMOS, *IEEE J Selected Topics in Quantum Electron.*, 2: 77–84, 1996". Flip-chip bonding, otherwise known as C4 bonding, is well known in the art and is used to create electrical interconnections and to laterally self-align the components as required for precision optical alignment.

For laser operation under electrical excitation, it is required that one of the contacting layers be p-type and that the other be n-type, as is understood in the art. It is contemplated that the p-layers and n-layers of the embodiments described herein may be interchanged without affecting the operation of the present invention.

Figure 4:
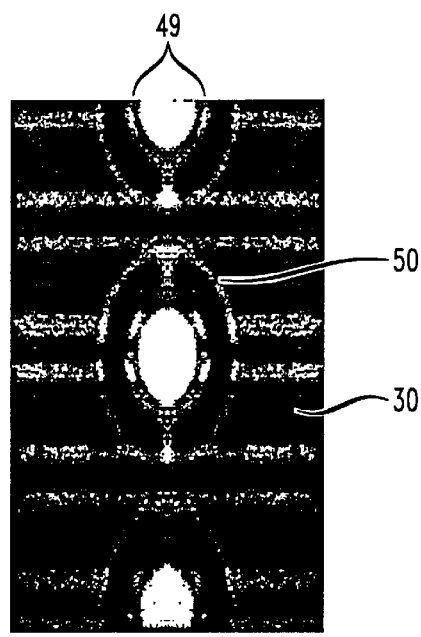
FIG. 4 is a microphotograph of a top view of an array of photodetectors on a single substrate different from an optical source substrate according to the present invention.

FIG. 4 is a microphotograph of a portion of a second embodiment of a fabricated photodetector array showing a portion of the detector array wherein each element is identically constructed and comprises a plurality of optical detectors 30 having a central n-contact 49 and two surrounding semi-circular co-planar p-contacts 50. It is contemplated that the n-contacts and p-contacts can be interchanged.

The first and second embodiments utilize fabrication techniques in which the photodetectors are grown on a separate substrate from the optical source, i.e., VCSEL. Therefore, it is not necessary to include reflective layers as required when fabricating a hybrid opto-electronic device (i.e., a VCSEL and a photodetector co-fabricated on a single substrate), as will be described herein below with reference to FIG. 5.

Figure 5:
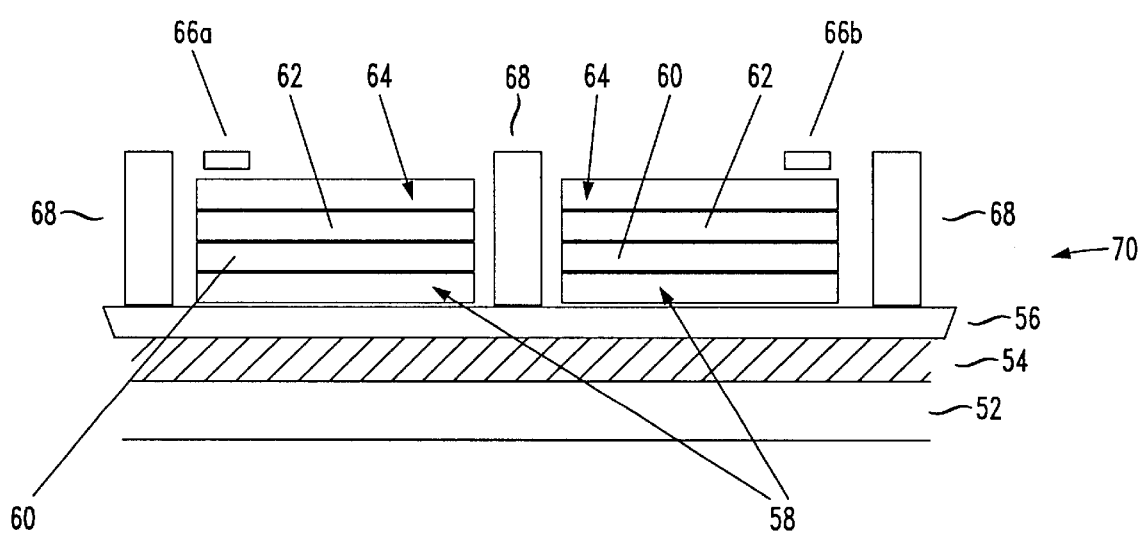
FIG. 5 is a schematic cross-sectional view of a hybrid opto-electronic device comprising a VCSEL and an optical detector co-fabricated on a single substrate according to the present invention.

FIG. 5 illustrates a third embodiment of the optical detector according to the present invention. As shown in FIG. 5, a VCSEL is co-fabricated with an optical detector on the same substrate to form a hybrid opto-electronic device 70. The hybrid device comprises a substrate 52, a stop-etch layer 54, a first reflecting layer 56, an n-type layer 58, an active layer 60, a p-type layer 62, a second reflecting layer 64, and two p-contacts 66a and 66b formed on the second reflecting layer. In this embodiment, the metallic ring 68 is embedded in the first reflecting layer 56. It is further contemplated that the first 56 and second 64 reflecting layers be selectively etched away from the detector portion of the hybrid opto-electronic device 70.

While the invention is susceptible to various modifications and alternative forms, specific embodiments thereof have been shown by way of example in the drawings and have been described in detail. It should be understood, however, that it is not intended to limit the invention to the particular forms disclosed, but on the contrary, the intention is to cover all modifications, equivalents and alternatives falling within the spirit and scope of the invention as defined by the appended claims.

What is claimed is:

1. A method for minimizing optical crosstalk in an optical detector having a substrate; a first layer formed of a semiconductor material containing impurities of a first type disposed above said substrate; an active region disposed above said first layer; a second layer formed of a semiconductor material containing impurities of a second type opposite of said first type and disposed above said active region; and a first contacting region in contact with and disposed above said second layer, said method comprising:

providing at least one barrier extending from said first layer to prevent light propagating substantially parallel to said first layer from reaching said active region.

2. The method of claim 1, wherein a longitudinal cross-sectional axis of said barrier is substantially perpendicular to said first layer.

3. The method of claim 1, wherein said first type includes an n-type impurity, and said second type includes a p-type impurity.

4. The method of claim 1, wherein the barrier is metallic.

5. The method of claim 1, wherein the barrier has a substantially annular shape.

6. The method of claim 1, wherein said barrier includes at least two substantially annular portions.

7. The method of claim 6, wherein at least one gap between said at least two substantially annular portions measures approximately 10 microns.

8. The method of claim 1, wherein the step of providing comprises the step of embedding said barrier in the first layer of said optical detector.

9. The method of claim 1, further comprising the step of providing an electrically conductive contact point on said barrier.

10. The method of claim 9, further comprising the step of providing said electrically conductive contact point on a top planar surface of said barrier.

* * * * *